(12) United States Patent
Kerner et al.

(10) Patent No.: US 11,083,097 B2
(45) Date of Patent: Aug. 3, 2021

(54) PRESSURE-EQUALIZING ELEMENT AND HOUSING CONTAINING SAME

(71) Applicant: CONTINENTAL AUTOMOTIVE GMBH, Hannover (DE)

(72) Inventors: Nikolaus Kerner, Wenzenbach (DE); Edward Kotowicz, Tegernheim (DE)

(73) Assignee: Vitesco Technologies GmbH, Hannover (DE)

(*) Notice: Subject to any disclaimer, the term of this patent is extended or adjusted under 35 U.S.C. 154(b) by 271 days.

(21) Appl. No.: 15/888,176

(22) Filed: May 2, 2018

(65) Prior Publication Data
US 2018/0263126 A1    Sep. 13, 2018

Related U.S. Application Data

(63) Continuation of application No. PCT/EP2016/068605, filed on Aug. 4, 2016.

(30) Foreign Application Priority Data

Aug. 5, 2015    (DE) .................... 10 2015 214 923.4

(51) Int. Cl.
*H05K 5/02*    (2006.01)

(52) U.S. Cl.
CPC ................. *H05K 5/0213* (2013.01)

(58) Field of Classification Search
CPC ........ H05K 5/0213; H05K 5/068; H05K 5/10; F21S 45/30; F21V 31/03; H02K 2205/09
(Continued)

(56) References Cited

U.S. PATENT DOCUMENTS 7,465,887 B2 * 12/2008 Suzuki ................. H05K 5/0047
                                                            174/520
9,255,719 B2 *  2/2016 Yano ......................... F24F 7/00
(Continued)

FOREIGN PATENT DOCUMENTS

CN           1774964 A        5/2006
CN         101066007 A       10/2007
(Continued)

OTHER PUBLICATIONS

"Machine Translation of WO2015063057." 2020.*
(Continued)

*Primary Examiner* — Kenneth J Hansen
*Assistant Examiner* — Dana K Tighe

(57) ABSTRACT

A pressure equalization element for equalizing the pressure of an interior space of a housing, in particular of an electric, motor or gearing housing, of a tank or the like, with respect to an outer side, is specified. The pressure equalization element includes a hole which is formed in a wall of the housing, a diaphragm which is attached on the interior space side in the region of the hole and which closes off the hole with respect to the outer side of the housing in water-tight but air-permeable fashion, and a holding structure which is formed on the housing in the region of the hole and which serves for accommodating an impact guard. The impact guard is connectable, on the outer side of the housing, to the holding structure and protects the diaphragm against mechanical action. A housing having the pressure equalization element is also specified.

20 Claims, 5 Drawing Sheets

(58) Field of Classification Search
USPC .......................................................... 454/184
See application file for complete search history.

(56) References Cited

U.S. PATENT DOCUMENTS

| | | | | |
|---|---|---|---|---|
| 9,955,609 | B2* | 4/2018 | Umeno | ................ H05K 5/0213 |
| 2005/0091949 | A1 | 5/2005 | Driglia Aulo | |
| 2006/0040092 | A1 | 2/2006 | Birk | |
| 2008/0196918 | A1 | 8/2008 | Zadach et al. | |
| 2010/0079021 | A1* | 4/2010 | Lorin | ................... H05K 5/0213 |
| | | | | 310/88 |
| 2014/0047981 | A1* | 2/2014 | Uemura | ................ B01D 69/10 |
| | | | | 96/4 |
| 2015/0330421 | A1* | 11/2015 | Kotowicz | ............... F21V 31/03 |
| | | | | 138/30 |
| 2015/0334863 | A1 | 11/2015 | Beer et al. | |

FOREIGN PATENT DOCUMENTS

| | | | |
|---|---|---|---|
| DE | 102006053114 A1 | 5/2008 | |
| DE | 102006053115 A1 | 5/2008 | |
| DE | 102008005395 A1 | 7/2009 | |
| DE | 102012223332 A1 * | 6/2014 | ........... H05K 5/0213 |
| DE | 102013100257 A1 | 7/2014 | |
| DE | 112013004771 T5 | 6/2015 | |
| EP | 1363069 A2 | 11/2003 | |
| EP | 1630769 A1 | 3/2006 | |
| EP | 1817948 A1 | 8/2007 | |
| EP | 1955901 A1 | 8/2008 | |
| JP | 2002134939 A * | 5/2002 | ............. H05K 5/068 |
| WO | 2014090235 A2 | 6/2014 | |
| WO | 2014095320 A1 | 6/2014 | |
| WO | WO-2015063057 A1 * | 5/2015 | ............. H02G 3/088 |

OTHER PUBLICATIONS

"Machine Translation of JP2002134939". 2020.*
International Search Report and Written Opinion dated Jun. 5, 2017 from corresponding International Patent Application No. PCT/EP2016/068605.
German Office Action dated May 3, 2016 for corresponding German Patent Application No. 10 2015 214 923.4.
Chinese First Office Action dated Sep. 19, 2019 for the counterpart Chinese Patent Application No. 201680046026.7.

* cited by examiner

A - A

B - B

PRESSURE-EQUALIZING ELEMENT AND HOUSING CONTAINING SAME

CROSS REFERENCE TO RELATED APPLICATIONS

This application claims the benefit of International application No. PCT/EP2016/068605, filed Aug. 4, 2016, which claims priority to German patent application No. 10 2015 214 923.4, filed Aug. 5, 2015.

FIELD OF INVENTION

This application claims the benefit of International application No. PCT/EP2016/068605, filed Aug. 4, 2016, which claims priority to German patent application No. 10 2015 214 923.4, filed Aug. 5, 2015, each of which is hereby incorporated by reference.

The invention relates to a pressure equalization element for equalizing the pressure of an interior space of a housing, in particular of an electrics, motor or gearing housing, of a tank or the like, with respect to an outer side, and to a housing having the pressure equalization element.

Electrical devices in sealingly closed housings, such as for example an engine controller, are exposed to diverse environmental influences despite the housing surrounding them. In the active state, said devices heat the air inside the housing. Said air expands and can give rise to a positive pressure in the housing interior. If the electrical devices are then deactivated, they cool down, and the interior pressure falls. The outside temperature can basically change much more quickly than the temperature in the well-sealed housing, for example in the event of a sudden intense summer storm.

In the case of air-tight electrical housings, such temperature fluctuations can lead firstly to condensation of air moisture, and secondly, the positive pressure and negative pressure exert load on the seals, such that the seal protection is weakened in the long term. It is also a problem that, in the presence of a negative pressure in the housing interior, it is additionally possible for moisture to be drawn into the interior. Since the moisture cannot escape again, it precipitates as condensate in the presence of temperature differences between the housing interior and the surroundings, and/or collects on the base. In the event of repeated temperature fluctuations, the quantity of water increases over time and can damage the installation and lead to corrosion and short-circuits. Depending on the usage situation, a failure of the installed components and devices can give rise to severe damage.

Pressure equalization elements serve for the aeration of electrical appliances in such sealingly closed housings, such as are used inter alia in automotive engineering. Such pressure equalization elements substantially prevent the ingress of water into the housing interior but permit an equalization of pressure differences, based for example on temperature changes, between interior air and surroundings.

From the prior art, pressure equalization elements are known in the case of which a gas-permeable diaphragm is adhesively bonded or welded directly to a bore situated in the housing of the electrical device. It is furthermore known for a covering label or a covering cap to be adhesively bonded or clamped directly to the diaphragm in order to protect the diaphragm. Here, it has proven to be a disadvantage that the diaphragm can lose its impermeability owing to various solids particles, such as for example dirt and dust, as a consequence of which faults and failures of the electrical devices can occur as a result of the effects discussed above. An exchange of the diaphragm is either not possible at all, or is complicated, expensive and laborious.

SUMMARY

It is an object of the invention to provide an improved compressed-air equalization element for housings, in particular for housings with electrical devices, which compressed-air equalization element is of simple construction and/or is easy to install, ensures reliable pressure equalization, and at the same time is in particular inexpensive and simple to produce.

According to one aspect of the invention, a pressure equalization element for equalizing the pressure of an interior space of a housing, in particular of an electrics, motor or gearing housing, of a tank or the like, with respect to an outer side is specified. According to a further aspect of the invention, a housing, in particular an electronics housing for a control unit of a motor vehicle, such as for example an engine control unit, is specified. According to another aspect, the invention relates to the control unit with the electronics housing.

The pressure equalization element has a hole which is formed in a wall of the housing, a diaphragm which is attached on the interior space side in the region of the hole and which closes off the hole with respect to the outer side of the housing in water-tight but air-permeable fashion, and a holding structure which is formed on the housing in the region of the hole and which serves for accommodating an impact guard. The holding structure may for example be formed on the housing or integrally formed on the housing. For example, a holding structure formed on a housing part manufactured from sheet metal can be produced particularly easily and inexpensively.

The impact guard is connectable, on the outer side of the housing, to the holding structure and protects the diaphragm against mechanical action.

It is thus advantageously possible for an unhindered pressure equalization between the housing interior and housing exterior to be ensured. The risk of damage to the diaphragm is particularly low.

The housing may for example be a housing for a control unit of a vehicle, which is installed in the wet region of the vehicle, for example in the engine bay. The diaphragm closes off the pressure equalization opening of the housing, wherein the diaphragm is arranged and configured to equalize the mechanical and/or thermal loads acting on seals and/or connecting points of the housing as a result of temperature and/or pressure fluctuations. For this purpose, the diaphragm is of semipermeable design. Accordingly, the diaphragm is on the one hand in particular permeable to air, wherein, on the other hand, it is for example not possible for water and dirt to ingress into the housing from the outside through the diaphragm.

In the case of a pressure equalization element without a covering cap, the housing may merely have a diaphragm adhesively bonded on at the inner side. Here, an aperture may be provided in the housing in the region of the diaphragm center. Here, the diaphragm and the aperture in the housing can very easily become contaminated. Furthermore, such a pressure equalization element offers no protection against mechanical loading of the diaphragm, such that, for example in the case of a water jet being oriented directly at the diaphragm, a detachment of the diaphragm may occur, which can in turn lead to faults and failures of the electrical or electronic components arranged in the housing.

As a result of the protection of the diaphragm in the case of the pressure equalization element according to the invention, the risk of a water jet acting directly on the diaphragm and destroying the latter is particularly low. It is thus possible to achieve a long service life of the diaphragm, such that a permanent and inexpensive pressure equalization between housing interior and the housing exterior can be ensured.

In one embodiment, the holding structure interacts with the impact guard such that the impact guard is held in positively locking fashion on the holding structure. By means of such an arrangement for pressure equalization, a structural-space-optimized solution for the arrangement and for the protection of the diaphragm is specified.

In a preferred embodiment, the holding structure extends along the housing in a bridge-like manner over the hole, wherein the bridge-like structure runs over the hole with a spacing. In this way, the holding structure can reduce the risk of damage of the diaphragm already before the connection to the impact guard.

In a further embodiment, the holding structure has a bore. In one refinement, the bore is formed centrally or at least substantially centrally over the hole of the housing. In this way, the impact guard can be easily centered over the hole.

In one embodiment, the impact guard has detent means which correspond with the holding structure and which interact with the holding structure such that the impact guard is held in positively locking fashion on the holding structure. Here, the detent means are in particular formed such that the detent means engage around the bridge-like structure and thus effect the positively locking connection of the impact guard to the holding structure. In this way, the seating of the pressure equalization element on the housing can be secured.

In one embodiment, the impact guard has an encircling web-like, that is to say in particular web-shaped, wall, which surrounds, that is to say in particular partially or fully engages around and/or laterally encloses, an interior space directed toward the housing, wherein the holding structure is received within the interior space, and wherein the detent means are arranged in the interior space of the impact guard.

In one refinement, the web-like wall has at least one opening, preferably two openings, for the aeration of and/or expulsion of water from the interior space. The opening(s) extend(s) through the wall in particular laterally.

In a particularly advantageous embodiment, on the impact guard, at least one web is provided per opening, wherein the web is arranged in the interior space of the impact guard correspondingly to the opening, and is oriented relative to the opening such that an ingress of spray water into the interior space of the impact guard is substantially prevented. In other words, the web is arranged in the interior space of the impact guard so as to be situated opposite the opening, and is oriented so as to prevent an ingress of spray water into the interior space of the impact guard. The risk of spray water impinging on the diaphragm is thus advantageously particularly low.

In one embodiment of the invention, the impact guard has, at least in regions, a two-shell wall with an inner wall and an outer wall. In one refinement, the outer wall extends across the inner wall with a spacing. The spacing is preferably flooded with air, that is to say in particular air can flow through the gap between inner wall and outer wall.

In one refinement, in the inner wall, there is arranged at least one connecting bore via which the interior space of the impact guard is connected to the surroundings of the impact guard such that an air flow can pass between the interior space and the surroundings of the impact guard via the connecting bore. In a particularly preferred refinement, the inner wall and the outer wall are connected to one another and spaced apart from one another by web-like connecting walls, wherein, in the inner wall and in at least one of the web-like connecting walls, there are arranged at least two connecting bores via which the interior space of the impact guard is connected to the surroundings of the impact guard such that an air flow can pass via the connecting bores between the interior space and the surroundings of the impact guard.

In one embodiment, it is provided that the holding structure is arranged in a depression on the outer side of the housing. The depression preferably has an outlet which extends at the level of the base of the depression in the direction of a housing edge and which serves for the expulsion of water from the depression. In one refinement, the housing has rampart-like elevations surrounding the depression, wherein the elevations are arranged around the depression in order to protect the impact guard against mechanical damage. In this way, the depression is advantageously protected against a laterally acting water jet, and thus the action of a direct water jet on the impact guard is advantageously prevented.

In a further embodiment, the impact guard is detachably connected to the holding structure, such that an exchange, for example in the event of damage, is possible at any time.

In an alternative design variant, the impact guard is connected to the holding structure permanently, that is to say in particular so as not to be detachable without destruction, wherein this has the advantage that an undesired release of the impact guard is prevented.

In a preferred embodiment, the holding structure is formed integrally with the housing. For example, the holding structure may be stamped, punched and/or milled into the housing wall, whereby it is possible for the respective indentation and/or cutout to be formed and shaped correspondingly to a forming tool that is used, whereby particularly simple, inexpensive and effective production of the housing can be ensured.

The housing is in particular an electrics, motor or gearing housing, a tank or the like with a pressure equalization element according to at least one of the embodiments described above.

Further features, possible uses and advantages of the invention will emerge from the following description of the exemplary embodiments of the invention, which are illustrated in the figures. It is to be noted here that the illustrated features are merely of a descriptive nature and may also be used in combination with features of other developments described above and are not intended to restrict the invention in any form.

BRIEF DESCRIPTION OF THE DRAWINGS

The invention will be discussed in more detail below on the basis of preferred exemplary embodiments, wherein the same reference designations are used for identical features. In the drawings, in each case in schematic form:

FIG. 1 illustrates a pressure equalization element 100 in a perspective exploded view. The pressure equalization element 100 illustrated in FIG. 1 is suitable for use in an only partially illustrated housing 110, in particular of an electrics, motor or gearing housing, of a tank or the like. FIG. 1 shows an outer side 114 of the housing 110 in the region of a housing edge 185.

To protect the pressure equalization element 100 against mechanical action, that region of the housing 110 in which the pressure equalization element 100 is arranged is formed as a depression 115, in the center of which there is situated a hole 120, which can be clearly seen for example in FIG. 3 and FIG. 8 and which is covered, from an inner side 112 of the housing 110, by a semipermeable diaphragm 130, which diaphragm prevents an ingress of water but permits a pressure equalization between the housing interior and the housing exterior. In FIG. 1, for illustrative purposes, the diaphragm 130 is shown in an enlarged illustration adjacent to the housing 110. Said diaphragm is however in fact situated below the hole 120 as can be seen in FIG. 8, such that said diaphragm would not be visible in the installed state in the view of FIG. 1.

Figure 1:
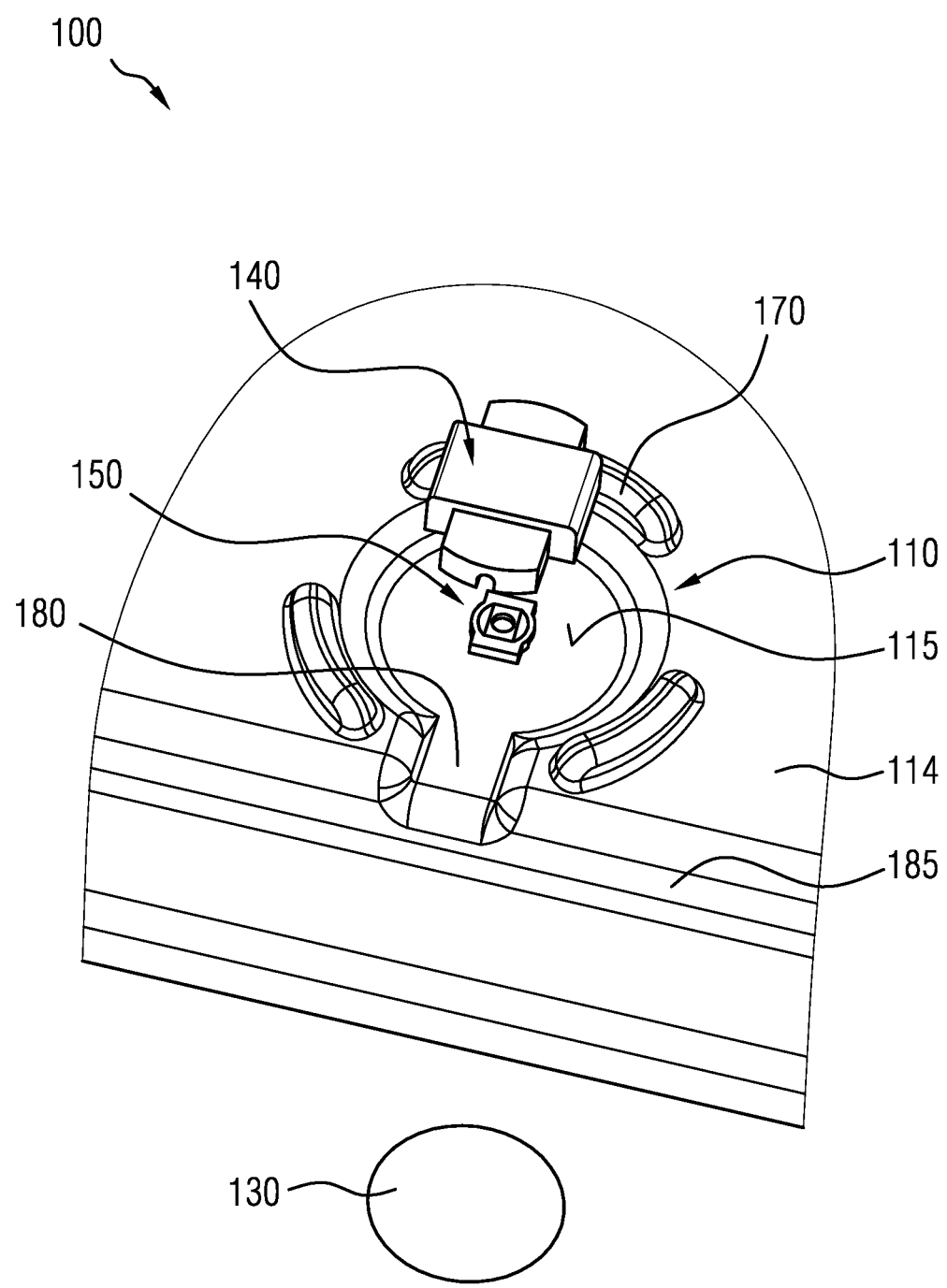
FIG. 1 shows a perspective exploded view of a pressure equalization element according to the invention.

In the illustrated embodiment, the pressure equalization element 100 is situated in the region of the housing edge 185, to which the depression 115 is connected via an outlet 180. The outlet 180 serves for conducting water that has accumulated in the depression 115 to the housing edge 185 and leading said water away from the pressure equalization element 100 in order to prevent the diaphragm becoming covered with water.

The depression 115 is surrounded by rampart-shaped elevations 170 which serve for keeping mechanical loads, such as for example direct water jets or objects which make contact with the housing 110, away from the pressure equalization element 100. In the illustrated embodiment, the rampart-shaped elevations 170 form a ring-shaped basic structure, wherein, between the elevations 170, there are arranged apertures 175, which in turn prevent a build-up of water within the rampart-like elevations 170.

Within the depression 115 and in the region of the hole 120, there is arranged a holding structure 150 which serves for fixing an impact guard 140 to the outer side 114 of the housing 100. The exact design of said holding structure 150 will be described at a later point.

Figure 2:
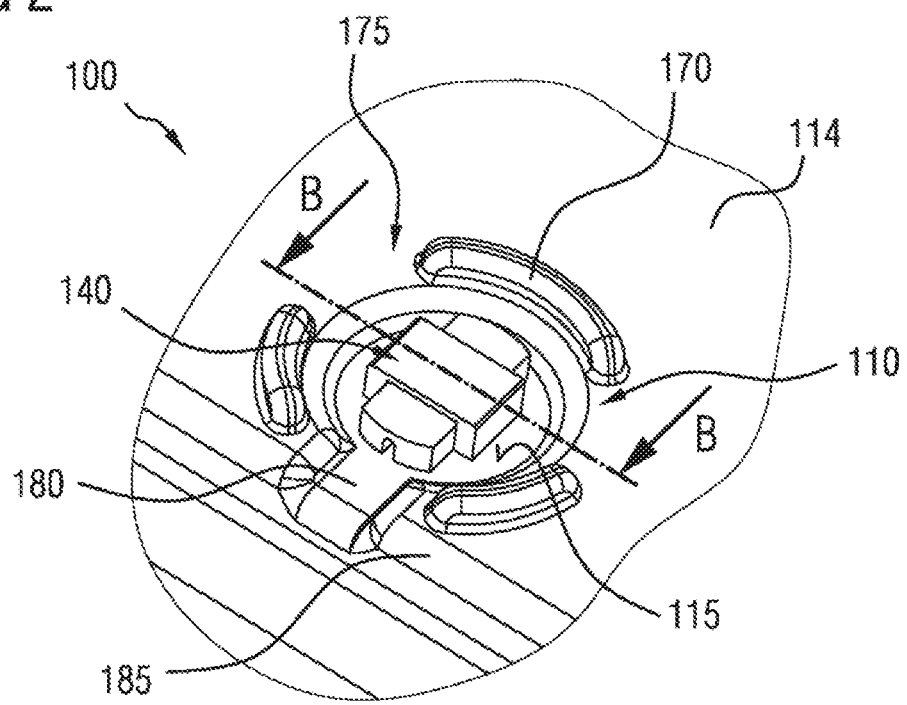
FIG. 2 shows a perspective view of the assembled pressure equalization element from FIG. 1.

FIG. 2 illustrates the impact guide 140 in the installed state. As can be seen, the impact guard 140 is situated, so as to be well protected against mechanical action, in the center of the depression 115, wherein the rampart-shaped elevations 170 still project beyond said impact guard, such that inadvertent stripping-off of the impact guard 140, or damage caused by objects making contact with the housing 110, is at least substantially ruled out.

Figure 3:
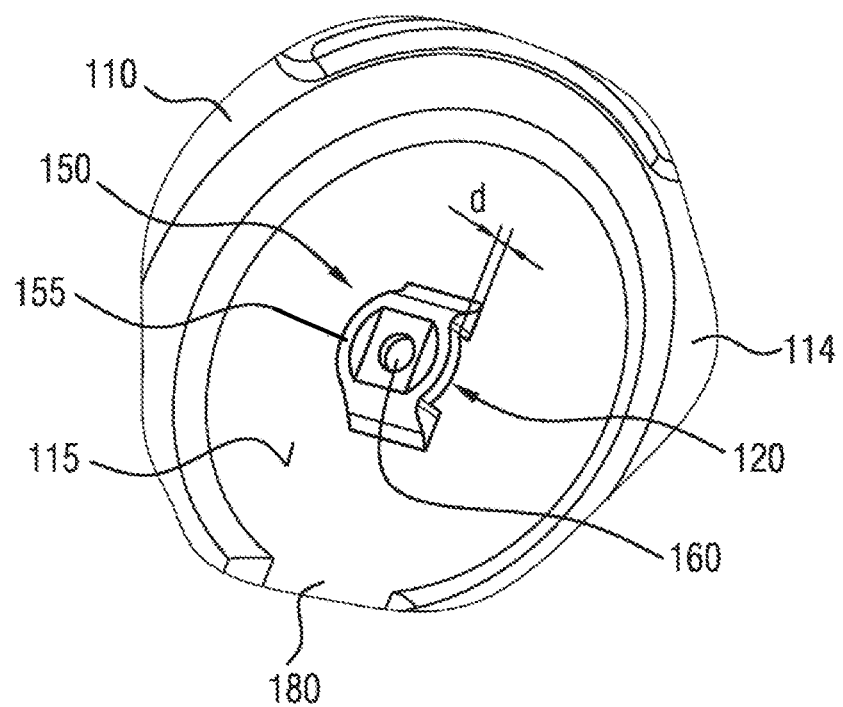
FIG. 3 shows a perspective view of the pressure equalization element from FIG. 1 without a fitted impact guard.

FIG. 3 shows a detail of the housing 110 around the region of the depression 115, wherein the outlet 180 can also be seen in the lower region of the figure. Furthermore, in FIG. 3, the hole 120 in the outer side 114 of the housing 110 is indicated, which hole serves for permitting the pressure equalization between the housing interior and the surroundings of the housing 110. The hole 120 is extended across by a bridge-shaped structure 155, which is part of the holding structure 150 for accommodating the impact guard 140. The bridge-shaped structure 155 has, measured perpendicular to the base of the depression 115, the spacing d from the hole 120.

In a region of the bridge-shaped structure 155 which corresponds substantially to the projection of the hole 120 onto the bridge-shaped structure 155 perpendicular to the outer side 114 of the housing 110, the bridge-shaped structure is extended through by a bore 160, which promotes a circulation of air between the housing interior and housing exterior.

Figure 4:
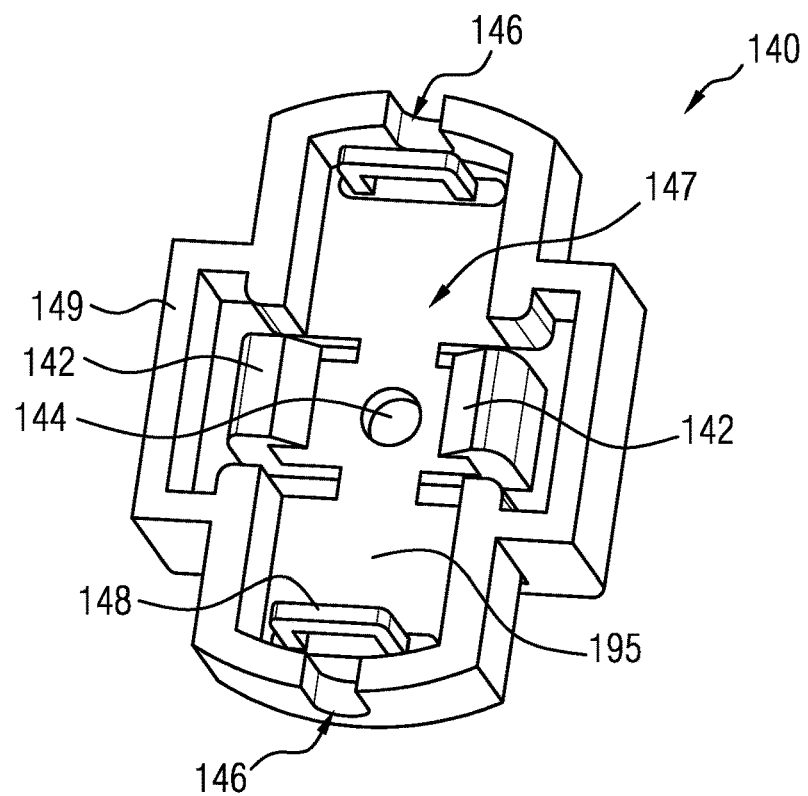
FIG. 4 shows a perspective view from below of the impact guard from a first perspective.
Figure 5:
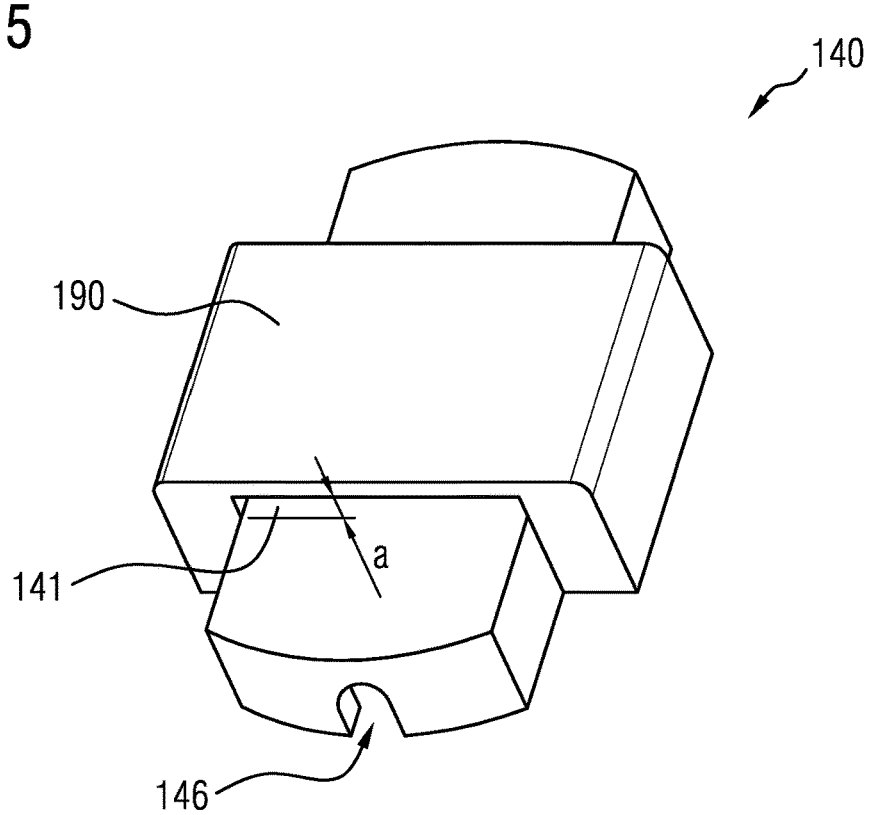
FIG. 5 shows a perspective plan view of the impact guard from a second perspective.

FIGS. 4 and 5 show the impact guard 140 according to the invention. FIG. 4 shows the impact guard 140 from its side facing toward the housing 110 in the installed state. Facing toward the viewer in this figure is an interior space 147 which is delimited by web-like walls 149, within which there are situated detent means 142 which are suitable for the fixing of the impact guide 140 to the holding structure 150, which detent means, in the installed state, engage around the bridge-shaped structure 155 of the holding structure 150 and engage with detent action into the intermediate space that is defined by the spacing d between the bridge-shaped structure 155 and the outer side 114 of the housing.

The web-like wall 149 is interrupted by two openings 146, which serve for the aeration of and/or expulsion of water from the interior space 147. Situated in the interior space 147—directly behind the openings 146—the impact guide 140 has in each case one web 148, such that a labyrinth-like flow path is formed which prevents the direct ingress of a water jet directed toward the respective opening 146.

The impact guard 140 has, at least in regions, a two-shell wall 149 with an outer wall 190 and with an inner wall 195 situated under said outer wall. The outer wall 190 extends across the inner wall 195 with a spacing a which is flooded with air, wherein the inner wall 195, in the region in which it is extended across by the outer wall 190, has a connecting bore 144. In the illustrated embodiment, the web-like walls 149 of the impact guide 140 have a cross-shaped contour by virtue of the fact that the outer wall 190 extends across the inner wall 195 perpendicular to the inner wall 195.

Figure 6:
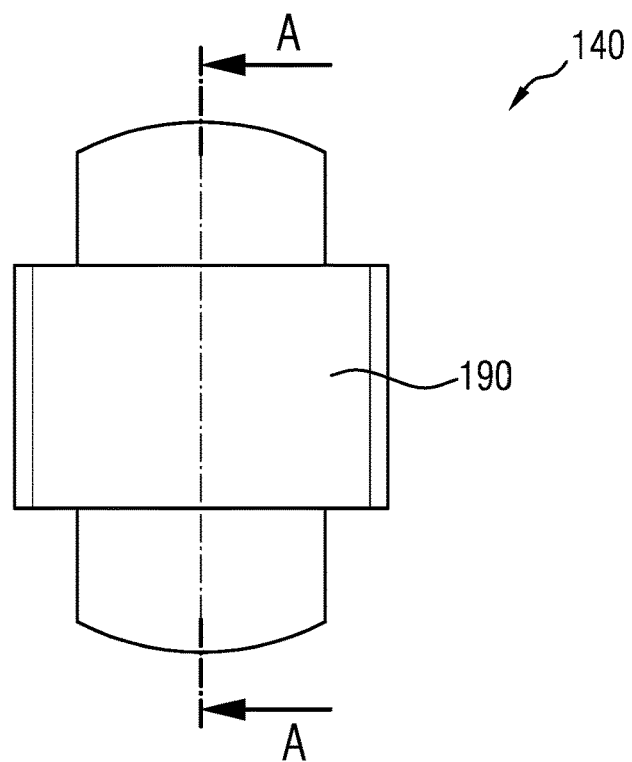
FIG. 6 shows a plan view of the impact guard from FIG. 1.
Figure 7:
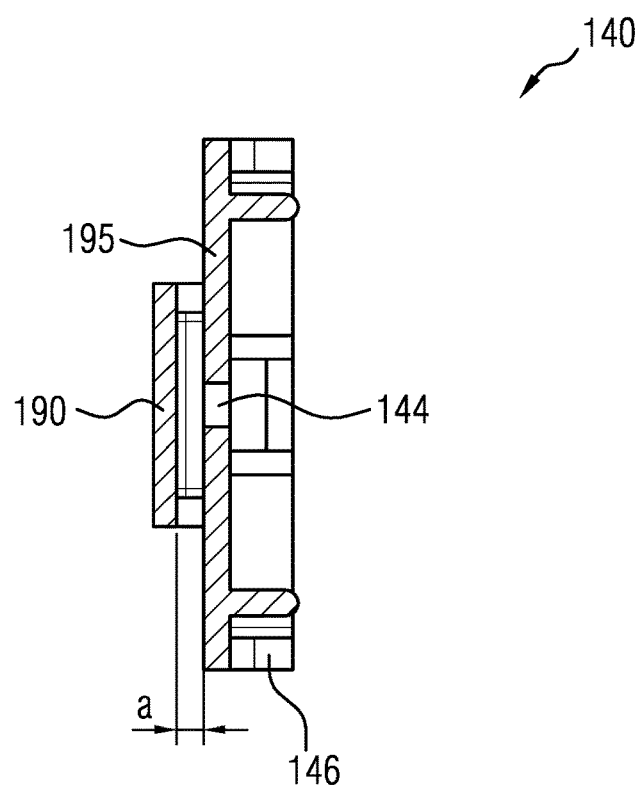
FIG. 7 shows a sectional view of the impact guard from FIG. 6 along the line A-A.
Figure 8:
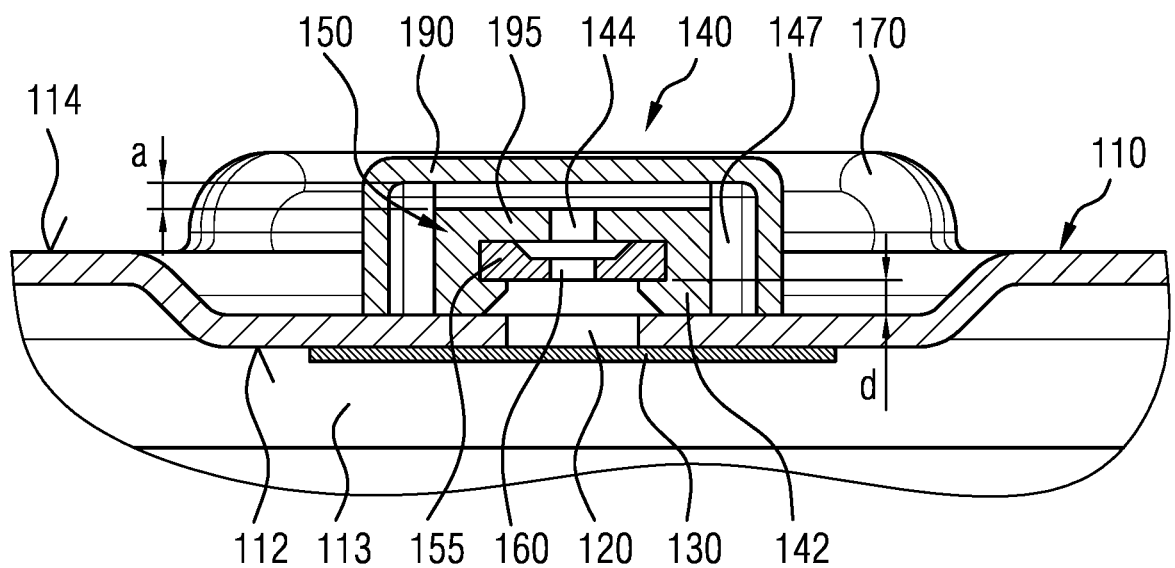
FIG. 8 shows a sectional view of the pressure equalization element from FIG. 1 along the line B-B.

FIG. 6 shows a plan view of that side of the impact guide 140 which faces away from the housing 110 in the installed state. FIG. 7 shows a cross section through the impact guide 140 along a section line A-A illustrated by dashed lines in FIG. 6; FIG. 8 shows a cross section through the pressure equalization element 100 along a section line B-B illustrated by dashed lines in FIG. 1.

It can be seen in FIG. 7 that the arrangement of the outer wall 190 and of the inner wall 195 allows air from the surroundings of the pressure equalization element 100 to pass through the gap formed by the spacing a that is flooded with air, and through the connecting bore 144, into the interior space 147 of the impact guard 140.

FIG. 8 shows the position of the diaphragm 130 on an inner side of the housing 110 below the hole 120. Over the outer side 114 of the housing 110, the hole 120 is extended across by the bridge-shaped structure 155 of the holding structure with the spacing d. The impact guard 140 engages with the detent means 142 around the bridge-shaped structure 155 and thus ensures the fixing of the impact guard 140 to the housing 110. The hole 120, the bore 160 and the connecting bore 144 in the inner wall 195 are, in the illustrated section, arranged one above the other on one axis. The inner wall is extended across, in the spacing a that is flooded with air, by the outer wall 190. It can also be seen from the figure that the spacing a that is flooded with air is connected to the interior space 7 via a channel which is delimited by the web-shaped wall 149, such that an exchange of air between the interior space 147 and the surroundings of the pressure equalization element 100 can take place via this path also. Owing to the nested configuration of the structure and the arrangement of the webs 148, it is furthermore the case that the risk of the diaphragm 130 being impinged on by spray water is particularly low.

In addition to the embodiment described and shown, further embodiments are conceivable which may comprise further modifications and combinations of features.

The invention claimed is:

1. A pressure equalization element for equalizing the pressure of an interior space of a housing, with respect to an outer side of the housing, the pressure equalization element comprising:
   a hole which is formed in a wall of the housing,
   a diaphragm which is attached on an interior space side in a region of the hole and which closes off the hole with respect to the outer side of the housing in water-tight but air-permeable fashion,
   a holding structure which is formed on the housing in the region of the hole, and
   an impact guard which is accommodated by the holding structure, the impact guard is connectable on the outer side of the housing to the holding structure and protects the diaphragm against mechanical action,
   wherein the impact guard has, at least in regions, a two-shell wall with an inner wall and an outer wall, the outer wall extends across the inner wall with a first spacing, and in the inner wall, there is arranged at least one connecting bore formed centrally over the hole of the housing by which the interior space of the housing is connected to surroundings of the impact guard such that an airflow path passes between the interior space of the housing and the surroundings of the impact guard via the at least one connecting bore,
   wherein the impact guard has an encircling web-shaped wall which surrounds an interior space of the impact guard and is directed toward the housing, and the holding structure is received within the interior space of the impact guard,
   wherein the web-shaped wall has at least one opening, for at least one of aeration of and/or expulsion of water from the interior space of the impact guard.

2. The pressure equalization element as claimed in claim 1, wherein the holding structure interacts with the impact guard such that the impact guard is held in positive locking connection on the holding structure.

3. The pressure equalization element as claimed in claim 1, wherein the holding structure has a bore, wherein the bore is formed centrally over the hole of the housing and the at least one connecting bore is disposed centrally over the bore of the holding structure.

4. The pressure equalization element as claimed in claim 1, wherein the impact guard has detents which correspond with the holding structure and which interact therewith such that the impact guard is held in positive locking connection on the holding structure.

5. The pressure equalization element as claimed in claim 4, wherein the detents are formed such that the detents engage around the holding structure and effect the positive locking connection of the impact guard to the holding structure.

6. The pressure equalization element as claimed in claim 5, wherein the detents are arranged in the interior space of the impact guard.

7. The pressure equalization element as claimed in claim 1, wherein on the impact guard, at least one web is provided for each opening of the web-shaped wall, wherein the at least one web is arranged in the interior space of the impact guard so as to be situated opposite the corresponding opening, and is oriented so as to prevent an ingress of spray water into the interior space of the impact guard.

8. The pressure equalization element as claimed in claim 1, wherein the impact guard is connected either detachably or permanently to the holding structure.

9. The pressure equalization element as claimed in claim 1, wherein the holding structure is an integral part of and integrally formed with the housing.

10. The pressure equalization element as claimed in claim 1, wherein the outer wall has an inner surface, the inner wall has an outer surface, the airflow path is defined at least in part by the inner surface of the outer wall and the outer surface of the inner wall, and the inner surface of the outer wall extends across an entire width of the outer surface of the inner wall.

11. The pressure equalization element as claimed in claim 10, wherein an opening between the impact guard and the surroundings of the impact guard has an area defined by the first spacing and the entire width of the outer surface of the inner wall.

12. A pressure equalization element for equalizing the pressure of an interior space of a housing, with respect to an outer side of the housing, the pressure equalization element comprising:
   a hole which is formed through a wall of the housing,
   a diaphragm which is attached on an interior space side in a region of the hole and which closes off the hole with respect to the outer side of the housing in water-tight but air-permeable fashion,
   a holding structure which is formed on the housing in the region of the hole, and
   an impact guard which is accommodated by the holding structure, the impact guard is connectable on the outer side of the housing to the holding structure and protects the diaphragm against mechanical action,
   wherein the impact guard has, at least in regions, a two-shell wall with an inner wall and an outer wall, the outer wall extends across the inner wall with a first spacing, and in the inner wall, there is arranged at least one connecting bore formed centrally over the hole of the housing by which the interior space of the housing is connected to surroundings of the impact guard such that an airflow path passes between the interior space of the housing and the surroundings of the impact guard via the at least one connecting bore, and
   wherein the holding structure includes an elevated structure which extends along the housing in a bridge-like manner over the hole, and the elevated structure runs over the hole with a spacing therefrom.

13. The pressure equalization element as claimed in claim 12, wherein the wall of the housing includes a depression formed along the outer side of the housing, the hole formed through the wall of the housing is defined in the depression such that the wall of the housing not forming the depression is elevated relative to the hole formed through the wall of the housing, and the holding structure is arranged on the outer side of the housing in the depression and above the hole formed through the wall of the housing.

14. A housing, comprising:
   a wall in which a hole is formed, and a pressure equalization element which equalizes pressure of an interior space of the housing, the pressure equalization element including
   a diaphragm which is attached in the interior space of the housing in a region of the hole and which closes off the hole with respect to an outer side of the housing in water-tight but air-permeable fashion,
   a holding structure which is formed on the housing in the region of the hole, and
   an impact guard which is detachably connected to the holding structure on an outer side of the housing and protects the diaphragm against mechanical action,
   wherein the impact guard comprises a two-shell wall with an inner wall and an outer wall, the outer wall extends across the inner wall with a first spacing, and in the inner wall, there is arranged at least one connecting bore formed centrally over the hole of the housing by which the interior space of the housing is connected to surroundings of the impact guard such that an airflow path passes between the interior space of the housing and the surroundings of the impact guard via the at least one connecting bore,
wherein the impact guard has an encircling web-shaped wall which surrounds an interior space of the impact guard and is directed toward the housing, and the holding structure is received within the interior space of the impact guard,
wherein the web-shaped wall has at least one opening, for at least one of aeration of and/or expulsion of water from the interior space of the impact guard.

15. The housing as claimed in claim 14, wherein the wall includes a depression formed along the outer side of the housing, the holding structure is arranged in the depression.

16. The housing as claimed in claim 15, wherein the depression has an outlet which extends at a level of a base of the depression in a direction of an edge of the housing and which serves for expulsion of water from the depression.

17. The housing as claimed in claim 15, wherein the housing has elevations surrounding the depression, wherein the elevations are arranged around the depression such that the impact guard is substantially protected against mechanical damage.

18. The housing as claimed in claim 14, wherein the outer wall has a planar inner surface, the inner wall has a planar outer surface, and the airflow path is defined at least in part by the planar inner surface of the outer wall and the planar outer surface of the inner wall, and the planar inner surface of the outer wall extends across an entire width of the planar outer surface of the inner wall.

19. The housing as claimed in claim 18, wherein an opening between the impact guard and the surroundings of the impact guard has an area defined by the first spacing and the entire width of the planar outer surface of the inner wall.

20. The housing as claimed in claim 14, wherein the holding structure has a bore, wherein the bore is formed centrally over the hole of the housing and the at least one connecting bore is disposed centrally over the bore of the holding structure.

\* \* \* \* \*